United States Patent [19]

Johnson

[11] E Re. 29,513

[45] Reissued Jan. 10, 1978

[54] ELECTRICAL CONNECTION APPARATUS

[75] Inventor: Lennart B. Johnson, Milford, N.H.

[73] Assignee: Teradyne, Inc., Boston, Mass.

[21] Appl. No.: 709,872

[22] Filed: July 29, 1976

Related U.S. Patent Documents

Reissue of:

[64] Patent No.: 3,917,375
Issued: Nov. 4, 1975
Appl. No.: 479,843
Filed: June 17, 1974

[51] Int. Cl.[2] ..... H01R 13/00

[52] U.S. Cl. ..... 339/112 R; 339/125 R; 339/241

[58] Field of Search ..... 339/112 R, 125 R, 126 R, 339/126 RS, 127 R, 128, 241, 242, 244 R, 244 VC, 248 R, 248 S, 253 R, 252 R, 252 P, 252 S, 256 R, 256 S, 256 SP

[56] References Cited

U.S. PATENT DOCUMENTS

| | | | |
|---|---|---|---|
| 3,097,906 | 7/1963 | Shannon | 339/256 SP X |
| 3,323,099 | 5/1967 | Spera | 339/126 R X |
| 3,917,375 | 11/1975 | Johnson | 339/112 R |

*Primary Examiner*—Roy Lake
*Assistant Examiner*—DeWalden W. Jones

[57] ABSTRACT

Electrical socket apparatus for integrated circuit packages and like devices has a contact for receiving the male connection element of the circuit device through an aperture in a folded spring section and for seating the male element at the mouth of the folded section. The shank of the contact is split, which forms two branches that provide a resiliently-acting interference fit of the shank within a contact-mounting aperture. A heat sink, preferably employed in a socket with the contact and nested within the profile of the contact spring section, has a heat receiving panel for abutting against the underside of the mounted circuit device.

20 Claims, 8 Drawing Figures

ELECTRICAL CONNECTION APPARATUS

Matter enclosed in heavy brackets [ ] appears in the original patent but forms no part of this reissue specification; matter printed in italics indicates the additions made by reissue.

BACKGROUND

This invention relates to electrical connection apparatus and in particular to socket apparatus for seatingly receiving the male connection elements of an integrated circuit package or like device. More particularly, the invention provides a novel contact for sockets of integrated circuit devices. The invention also provides a socket incorporating the contact and disposing a heat sink contiguously below the circuit device.

Advantages of the socket apparatus of the invention are facile yet secure mounting on a panel or other member, secure electrical engagement with the mating electrical element, and compact seating of the circuit package being mounted. In addition, the heat sink provides thermally efficient heat transfer from the circuit package, with little or no increase in the overall space requirement.

A general object of the invention is to provide an electrical contact; for use in a circuit board socket for an integrated circuit device, which provides reductions in the required space and improvements in both the mechanical and the electrical connections.

A specific object is to provide an electrical contact of the above character which seats a mating connection element in a clip having a virtually open bottom. Attainment of this feature enables a device which is plugged into the contact to locate at a minimal spacing above the contact mounting structure, e.g. a circuit board, essentially without regard to the length of the leads on the device. Another object is that the contact engage the mounting structure with a secure press-fit, but yet with relatively low insertion force. A further object of the invention is to provide a contact of the above character which occupies minimal space and hence can be mounted on a circuit board in a high density arrangement with other contacts and circuit elements.

It is also an object of the invention to provide an electrical contact having the foregoing features and which has secure resilient engagement with the mating electrical element. It is a further object that the contact provide this resilient engagement with a controlled preload.

Another object of the invention is to provide a contact of the above type which has a low profile above the mounting circuit board or other structure, which can readily provide a plate contact area for the mating connection element, and which yet is relatively easy and low cost to fabricate.

It is also an object of the invention to provide an electrical socket incorporating a contact having the foregoing features. A further object is to provide a compact heat sink for socket apparatus of the foregoing character and which conducts heat from a circuit device close to the site of heat generation therein.

Other objects of the invention will in part be obvious and will in part appear hereinafter.

GENERAL DESCRIPTION

A socket for mounting and connecting an integrated circuit dual in-line package to a printed circuit board in accordance with the invention has improvements with regard to mounting the socket to a printed circuit board or other mounting member, with regard to the socket contact that receives and electrically interconnects the male connection element of the package to further circuitry, and with reard to a heat sink for dissipating heat generated within the circuit package.

The socket contact has a shank section that seats the contact in an aperture through the printed circuit board or other mounting member, has a conventional wire-wrap or solder termination extending below the board, and has an upper interconnect section. The intermediate shank section is split or apertured to form two flexible branches. Upon insertion of the contact into the mounting aperture, these branches interfere with the aperture walls and resiliently flex inward. The resilient force of the flexed branches maintain the installed contact in resilient engagement with the aperture, which ensures secure mechanical mounting as well as continued reliable electrical contact where the mounting aperture has a conductive plating.

The upper interconnect section of the contact has a folded spring clip that receives and electrically engages a male connection element. The fold is disposed uppermost on the contact and faces downward, i.e. the arms of the folded structure extend from the fold toward the shank section. A mating male connection element engages the contact by passing through an aperture in the fold to extend into the spring clip, where it is compressively engaged between the ends of the folded structure. The length of the folded structure forms the spring clip with a long effective spring length, which is desirable for secure resilient engagement with the mating connection element. The foregoing contact configuration is readily fabricated from a single strip of material with a stamping process, and requires no milling or like cutting.

The foregoing and other features, described hereinafter, of the contact configuration provide secure and firm mechanical and electrical engagement of the contact within a plated-through circuit board mounting hole, and of the mating connection element with the contact. Moreover, the contact has a low profile above the circuit board on which it is mounted, as well as being compact in the lateral dimension for a high density with other structure on the circuit board. In addition, the mating connection element can extend beyond the folded spring clip into abutting relation against the circuit board. This enables the contact to mount the circuit package in utmost proximity to the circuit board, thereby minimizing the space required for the mounted circuit package. Still further, the contact can be configured to dispose the mouth of the spring clip within the circuit-board or other mounting aperture. This allows the mating connection element to extend into the contact-mounting aperture for an even lower profile of the contact alone and, more importantly, of the mounted circuit package.

The socket contact accommodates a heat sink disposed below the circuit package and contiguous with the package underside, which is the location where many circuit packages generate heat. Hence, this underside disposition of the heat sink enhances the dissipation of heat from the circuit package. Fins of the heat sink, however, can extend laterally outward and upward from the contact-mounting socket to provide a large radiating surface without detracting from a high density structure on the circuit board itself.

The invention accordingly comprises the features of construction, combinations of elements, and arrangement of parts exemplified in the constructions hereinafter set forth, and the scope of the invention is indicated in the claims.

BRIEF DESCRIPTION OF DRAWINGS

For a fuller understanding of the nature and objects of the invention, reference should be made to the following detailed description and the accompanying drawings, in which.

DESCRIPTION OF ILLUSTRATED EMBODIMENTS

Figure 1:
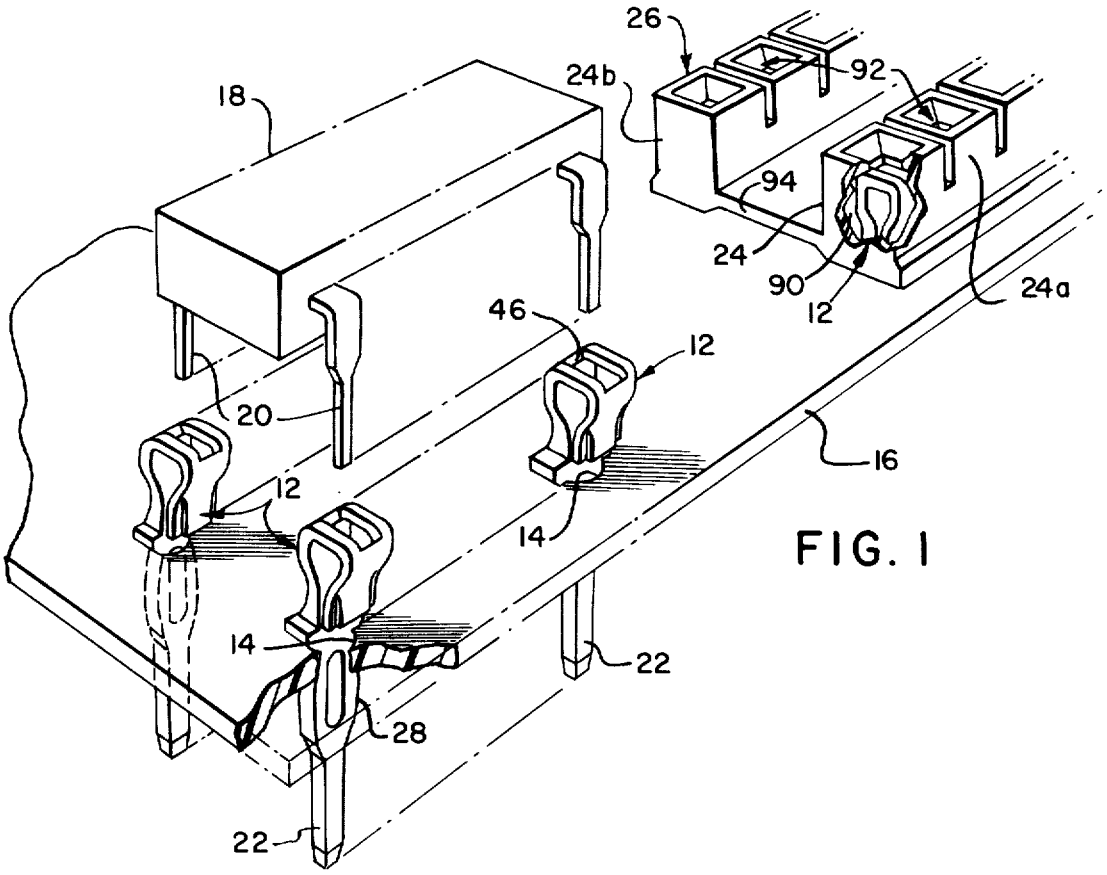
FIG. 1 is a perspective exploded view of a set of contacts embodying the invention and mounted on a board-like panel for receiving an integrated circuit package, and further shows a socket incorporating the contacts.

FIG. 1 shows a set of contacts 12, each press fitted into a separate aperture 14 through a printed circuit board 16 or other mounting panel. The contacts mount an electrical device, illustrated as an integrated circuit package 18 having the conventional dual in-line configuration, to the board 16 and electrically interconnect each male pin 20 of the package to conductors plated on the board and/or to wire-wrap or solder connections. The latter connections are made in a conventional manner via tail sections 22 of the contacts. The set of contacts 12 generally is housed in a socket body 24 to form a unitary socket 26.

Figure 3:
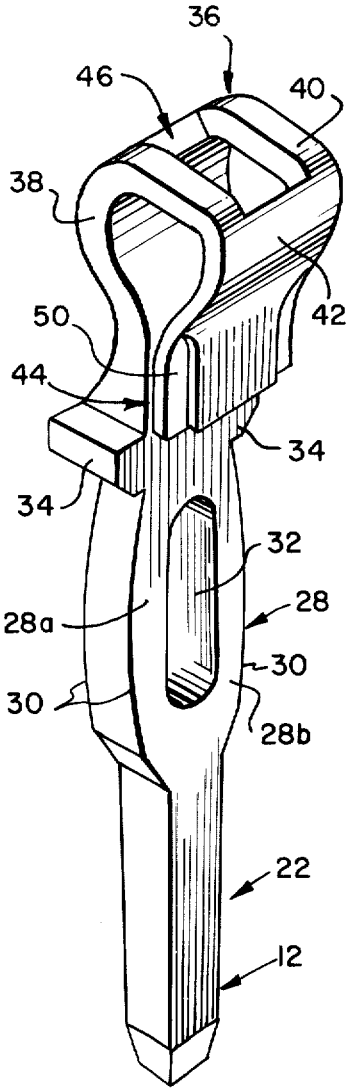
FIG. 3 is a perspective view of a single contact as shown in FIG. 1.
Figure 4:
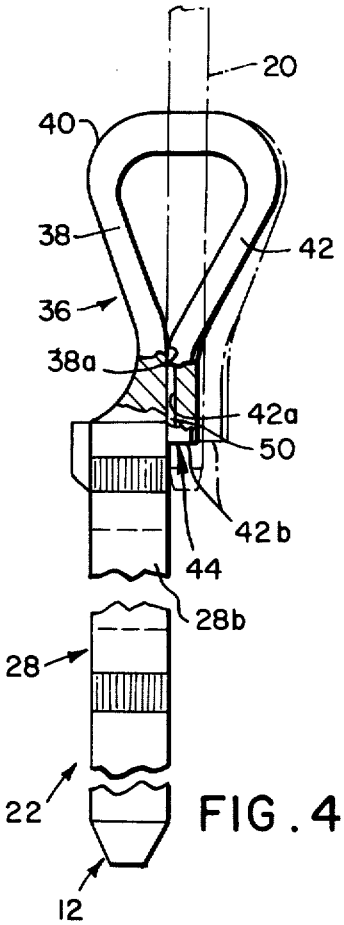
FIG. 4 is a side elevation view of the contact of FIG. 3 partly broken away.

As shown in detail in FIGS. 3 and 4, each contact 12 preferably is fabricated from a single strip of metal or other electrically-conductive material and has an intermediate shank section 28 between the tail section 22 and a folded spring section 36. The shank section mounts the contact seated within a mounting hole, e.g. hole 14 of FIG. 1, and has sidewall edges 30 that compressively engage the mounting hole. Where the mounting hole is plated through with metal, the contact edges 30 engage the plating with an interference fit to provide both mechanical attachment of the contact with the mounting board and secure electrical contact with the plating.

To enhance these connections and facilitate insertion of the contact into the mounting hole, the shank section 28 is split, more particularly is apertured as indicated at 32, to form two resilient shank branches 28a and 28b. The shank section is dimensioned so that the branch corners 30 interfere with the mounting aperture. As illustrated, the width of the shank section can be larger than that of the tail section, with the transition being tapered to provide wedging surfaces for insertion. With this construction, upon insertion of the shank section into the mounting aperture, the branch edges deform, and imbed into, the aperture walls. In addition, however, the branches resiliently flex inward, i.e. into the aperture between them. This reduces the force otherwise required to insert the contact. It also provides a continuous, persisting outward resilient pressure of the branch edges against the aperture walls. This in turn maintains the contact shank section continuously in firm engagement with the mounting aperture. The contact hence remains securely mounted, and is resistant to dislodgement by shock and other abuse.

Where desired, the shank branches can be bowed outward prior to insertion. This can increase the interference fit, and the amount of inward flex the branches can accommodate without exceeding their elastic limit.

With further reference to FIGS. 1, 3 and 4, each contact 12 has a pair of laterally-extending shoulders 34 adjacent the upper end of the intermediate section and which butt against the contact-mounting board when the contact is fully inserted therein, as in FIG. 1.

The spring section 36 extends upward from the shoulders with one spring arm 38 being an extension of the contact-forming material strip and in line with the tail and shank sections 22 and 28, respectively. A flattened fold 40 of the spring section is at the end, uppermost in the illustrated orientation, of the contact 12. The other arm 42 of the spring section extends from the fold back along the first arm to form a clip 44 that engages the mating connection element, e.g. a pin 20. The illustrated contact-forming strip is thinner in the spring section 36 than in the tail and intermediate sections. This facilitates providing the desired flex in the former section and the desired rigidity in the latter sections.

As FIG. 4 shows, a male connection element 20 is inserted into the contact clip, to seat in the clip 44 between the ends of arms 38 and 42, through an aperture 46 in the flattened fold 40 and aligned with the clip 44 contact areas.

The spring section 36 thus has, when viewed from the side as in FIG. 4, a generally closed U-shaped configuration with the arms 38 and 42 forming the sides of the U-shape. Further, a flat inner surface 38a at the base of the arm 38 faces an inner surface 42a on a tab end 42b of arm 42, to form the clip 44 contact areas. The length of the spring section, i.e. of the arms and the fold, between these contact surfaces forms a spring to urge the surface 42a against the surface 38a. However, the contact tab 42b preferably has two protrusions 50 that abut the surface 38a and that flank the contact surface 42a to space it by a narrow gap from the surface 38a. The recessed surface 42a and the opposed surface 38a generally are plated with material, typically gold or tin, that has superior electrical contact properties, e.g. corrosion resistance and low electrical contact resistance.

The foregoing construction provides a contact that securely grips and electrically connects the mating male element, i.e. pin 20. The long length of the spring section which the folded construction provides has a low spring constant, as desired, and without resort to ultra-thin structure. Further, because the height of the two protrusions on the contact arm 42 can readily be controlled to a close tolerance, the protrusions provide the contact clip 44 with a controlled preload pressure for engagement with the mating male element. Also, the gap which these protrusions form enables the critical contact surfaces 38a and 42a to be plated with an electrical contact material. The contact is compact in both lateral dimensions and with regard to its profile above the supporting circuit board 16. The lateral compactness enables the circuit board to carry other electrical elements, including plated connections threading between the contact-mounting apertures 14, which relatively high density. The low profile of the contact itself is enhanced by the fact that it mounts a circuit package, such as the FIG. 1 package 18, close to the mounting board 16; this is because the contact allows the male connection elements on that package to extend into direct abutment with the board through the downwardly-facing open contact clip 44. Finally, the contact is readily fabricated, typically by stamping from a single strip of metal, with the protrusions and with the recess-flanking protrusions being cold-formed as by coining.

Figure 2:
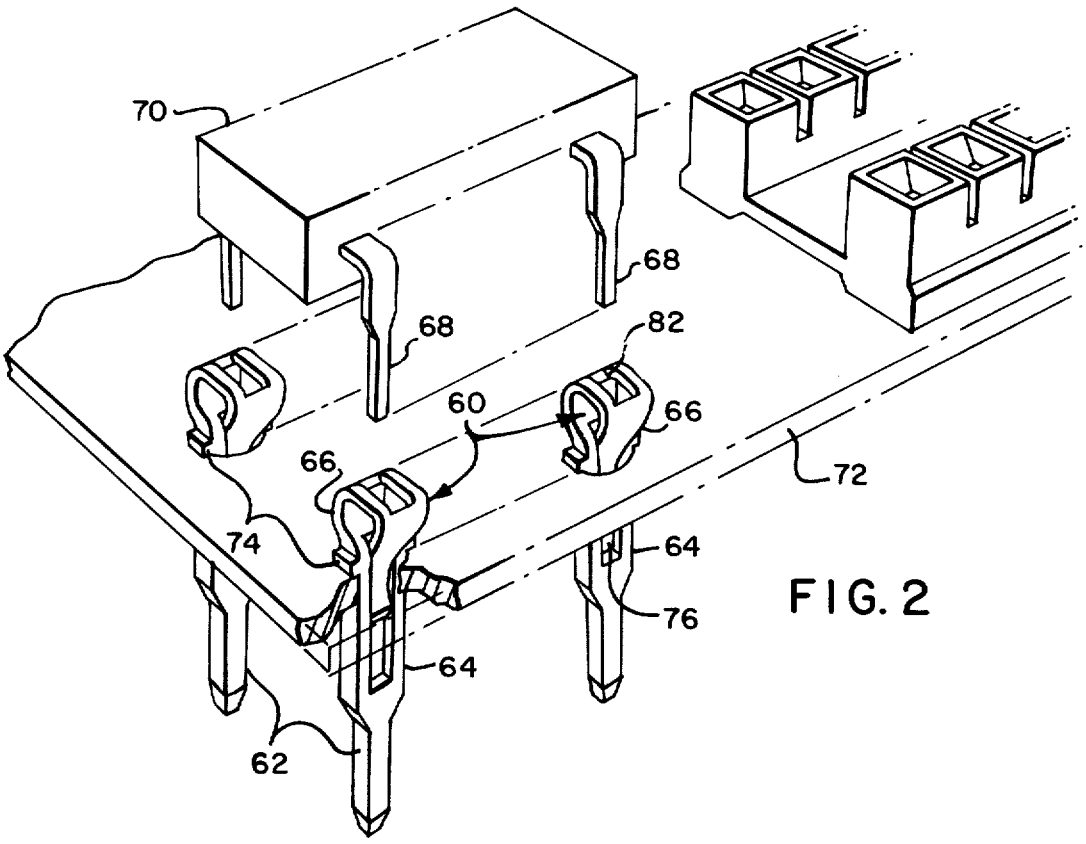
FIG. 2 is a view similar to FIG. 1 illustrating contacts embodying a further construction according to the invention.
Figure 5:
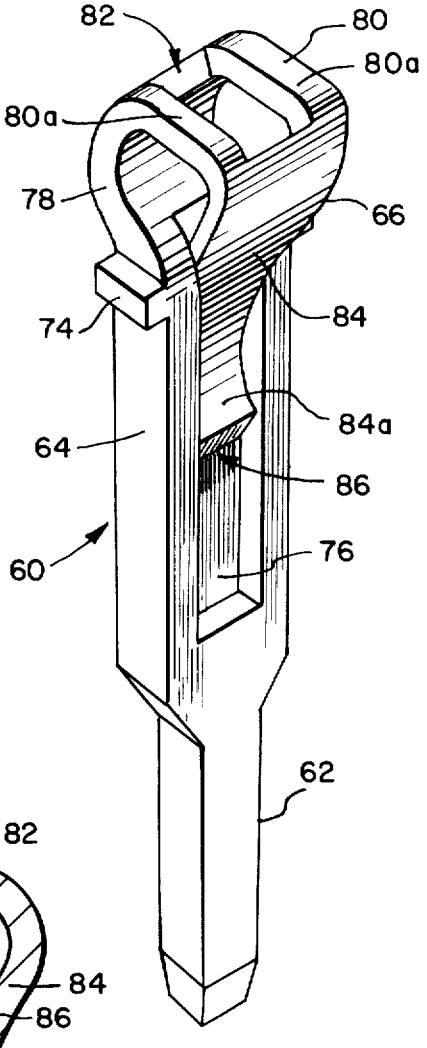
FIG. 5 is a perspective view of a single contact having the construction shown in FIG. 2.
Figure 6:
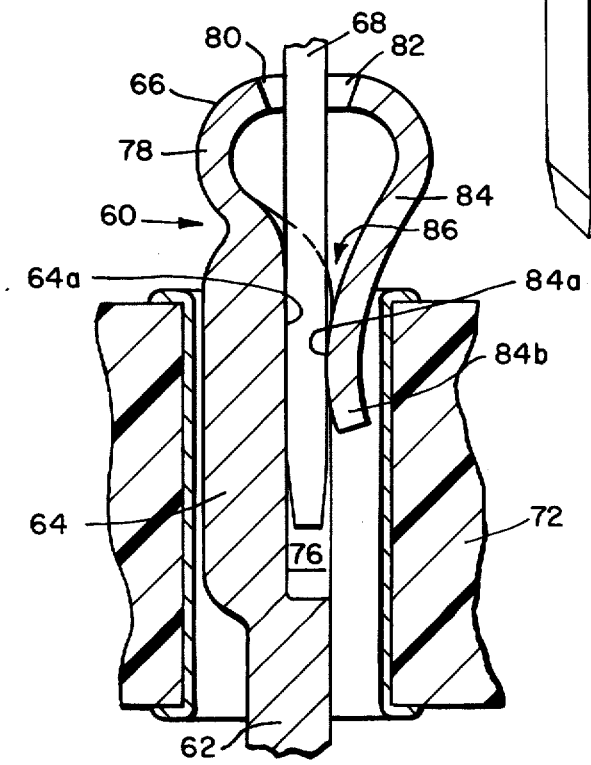
FIG. 6 is a side elevational sectional view of the contact of FIG. 5 seated in a plated-through hole of a printed circuit board with a mating connection element seated therein.

FIGS. 2, 5 and 6 show another contact 60 having many features of the contact 12, in addition to an even smaller profile or height above the contact-mounting member. The contact 60 preferably is formed from a single strip of metal with a tail section 62, and intermediate shank section 64, and a folded spring section 66 for engaging a male connection element, such as a pin 68 on the integrated circuit package 70 illustrated in FIG. 2.

However, in contrast to the FIG. 1 contact 12, the spring section 66 of the contact 60 is partly recessed within the mounting panel, e.g. the printed circuit board 72, and accommodates extension of a male connection pin 68 below the circuit board. Specifically, the contact 60 mountingly seats in a hole through the circuit board and has a pair of laterally-protruding shoulders 74 that control the depth of insertion into the circuit board.

The intermediate shank section 64 extends in line with the tail section 62 between the latter element and the shoulders 74. A pin-receiving channel 76 recesses the shank section along the major portion of its length from the shoulders 74 to adjacent the tail section 62. The channel 76 preferably is coldformed, and hence the side of the intermediate section opposite the channel 76 bulgingly protrudes outward as FIG. 6 indicates. The spring section 66 extends from the intermediate section above the shoulders 74 with an upwardly-extending arm 78, a flattened fold 80 pierced by a pin-receiving aperture 82, and a downwardly-extending arm 84. The lower tab end 84b of arm 84 nests within the channel 76 below the shoulder 74, and hence below the circuit board upper surface when the contact is mounted.

The clip 86 of the contact 60 is formed by the shank surface 64a at the bottom of the channel 76, and the inner surface 84a of the tab 84b. The length of the spring section 66, i.e. of arm 78, flattened fold 80 and arm 84, resiliently urges the tab surface 84a into the channel 76 toward surface 64a, for resiliently engaging the mating male connection element 68.

The lower-profile contact 60 of FIGS. 2, 5 and 6 generally has somewhat larger lateral dimensions than the contact 12 of FIG. 1, in order to accommodate the channel 76. However, this is the only additional space which the contact 60 requires in order to seat a mating connection element within the same hole in which the contact itself is mounted.

The aperture 82 in the fold of the contact spring section 66 generally lies in a plane transverse to the longitudinal extension of the contact, i.e. of the tail and shank sections. Further, the aperture peferably is centered along the width of the spring section, i.e. is centered in the flattened fold between two beam portions 80a that span between the arms 78 and 84. The aperture is further aligned with the opposed surfaces 64a and 84a in the contact clip 86. With this illustrated preferred configuration, the male pin 68 passes along a straight path through the aperture 82 and into the channel 76 for engagement by the contact clip 86. The FIG. 1 contact 12 preferably has the aperture 46 configured in the same manner relative to the clip 44 of that contact.

With further reference to FIGS. 1 and 2, the contacts 12 as well as the contacts 60 can, as illustrated, be mounted separately on a panel or like mounting member independent of other structure. Alternatively, each contact can be incorporated in a multiple contact socket, with the contact portion above the mounting member seated within the contact body. For example, FIG. 1 shows a socket 26 having a socket body 24 molded of conventional insulating material and incorporating the illustrated two rows of contacts 12 arranged in the conventional manner for seatingly receiving a conventional dual in-line package 18.

Figure 8:
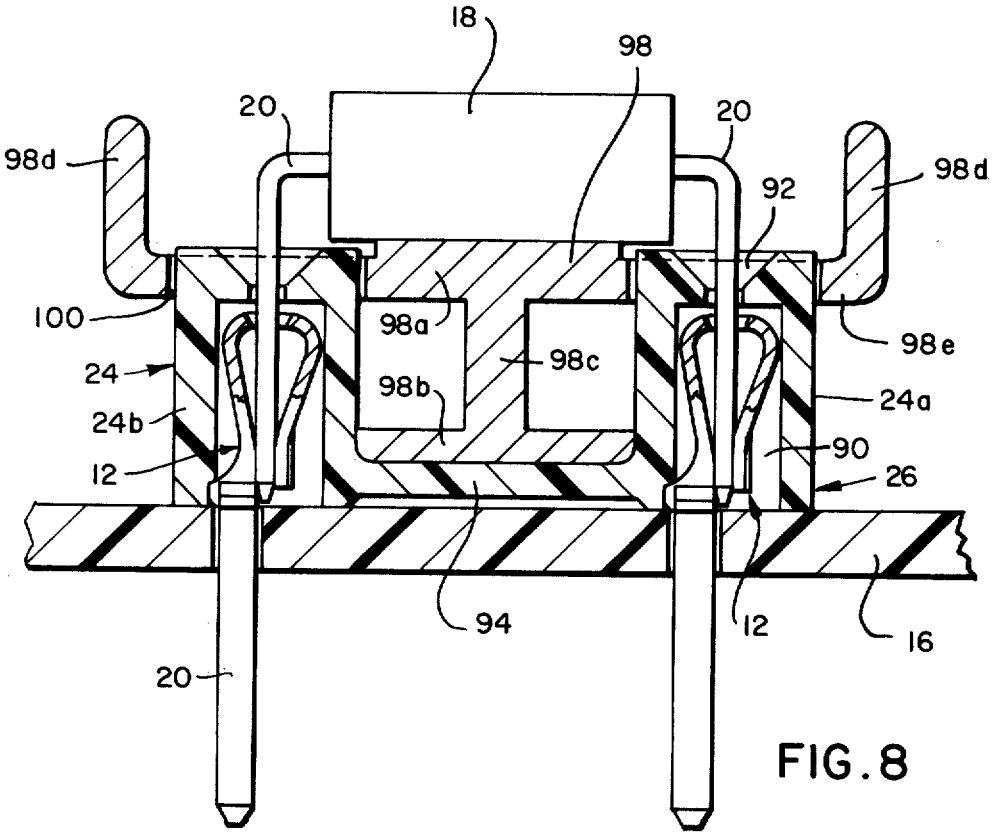
FIG. 8 is a side elevational, cross-sectional view of a heat sinking socket according to the invention.

In particular, FIGS. 1 and 8 show the socket body 24 is molded with a separate cavity 90 to accommodate the spring section of each contact. Each cavity has an upper opening 92 aligned above the aperture 46 of the contact therein and through which a male connection element can extend into the contact clip. The outer walls 24a and 24b of the two rows of cavities form the outer sidewalls of the socket, and a web 94 joins the cavity inner walls. Hence the socket body 24 has a generally U-shaped cross-section. The web is located at the base of the cavities and hence is adjacent the contact-mounting board 16. As further illustrated, however, it is preferable that the web be spaced by a small gap above the circuit board so that, when the socket is installed, the socket body 24 abuts the circuit board at the bases of the cavities 90 and not at the web 94.

As FIG. 8 illustrates, a heat sink 98 can seat within the void in the socket body between the two rows of cavity enclosures and above the web 94. This location of the heat sink 98 disposes it contiguously below the underside of the circuit package 18 plugged into the socket. This is desirable because many integrated circuit structures contain the heat generating elements proximal to their bottom wall, and hence the underside disposed heat sink 98 is seated against the circuit package closely adjacent the site of heat generation therein. The heat sink 98 preferably has an overall I-beam-like configuration within the socket body, with the top flange member being a panel 98a located just above the upper surface of the socket body 24 to protrude upward therefrom to ensure that it seats against the circuit package. The lower flange member 98b is bottomed within the socket body adjacent web 94 and the web member 98c spans between the upper and lower members, as shown. With this illustrated construction, the heat sink which typically is extruded of metal or other thermally conductive material, is removably seated on the socket body by an interference fit of the lower flange member 98b within the body.

Figure 7:
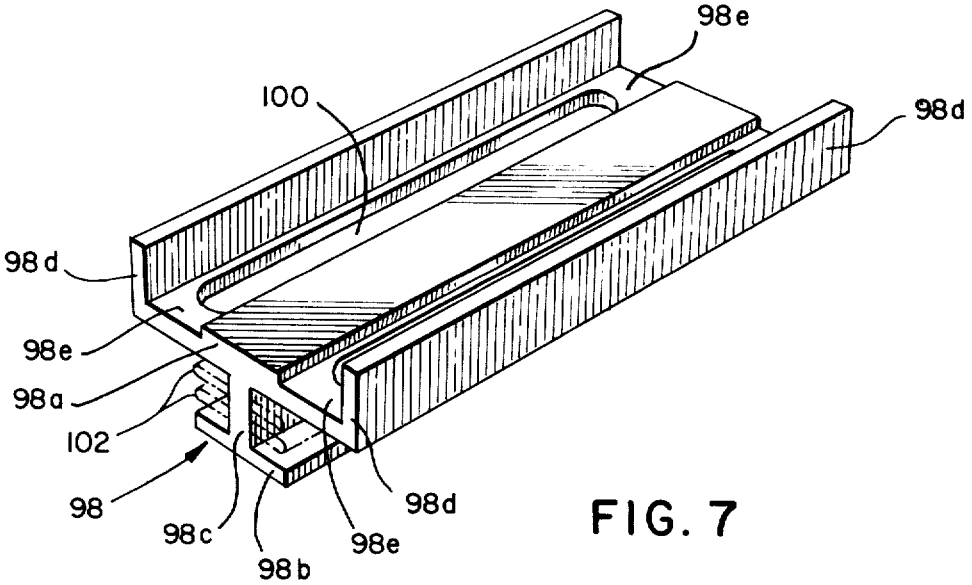
FIG. 7 is a perspective view of a heat sink construction according to the invention.

FIGS. 7 and 8 show that the full structure of the illustrated heat sink 98 has, in addition to the structure already described, a pair of upstanding outrigger fins 98d located on either side of the socket body. Webs 98e affix the latter fins to the central portion of the heat sink. Elongated slots 100 in these webs receive the upper ends of the socket body to seat the heat sink thereon, as FIG. 8 shows, and allow the pins of the circuit package to enter the socket.

As FIG. 7 further shows with dashed lines, the heat sink 98, independent of whether it includes the webs 98e and fins 98d, can carry additional radiating fins 102 protruding from the central web 98c.

It will thus be seen that the objects set forth above, among those made apparent from the preceding description, are efficiently attained. Since certain changes may be made in the above constructions without departing from the scope of the invention, it is intended that all matter contained in the above description or shown in the accompanying drawings be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described the invention, what is claimed as new and secured by Letters Patent is:

1. Panel-mounted electrical socket apparatus for a circuit device from which extend leads arranged in two side-by-side rows, said apparatus comprising A. first and second side-by-side rows of socket contacts, 1. each socket contact extending within a separate aperture in [*each*] *such* panel and having a folded contact clip disposed at least partly thereabove, 2. said contact clip having a folded, inverted, U-shaped configuration including a first clip arm extending toward and within the aperture, a bridging fold uppermost on said clip and apertured to receive a lead of said circuit device, and a second clip arm extending alongside said first clip arm and forming a resiliently-expandable contact area therewith for receiving therebetween the electrical lead, and B. a heat sink of thermally-conductive material having an upper panel disposed between said rows of socket contacts and arranged for contiguous abutment against the bottom of such circuit device.

2. Socket apparatus as defined in claim 1 further comprising a resiliently compressible shank member on each socket contact located and compressively engaged within the aperture in such panel.

3. An electrical socket contact, of electrically-conductive material, for mating engagement with a male connection element, said contact comprising, in combination, A. a mounting section longitudinally extending between first and second locations thereon for mounting said contact within an aperture through a panel-like support member with said locations thereof being accessible for electrical contact at opposite sides of said support member, and for transferring an electrical signal with a further conductor, and B. a folded contact clip 1. having first and second arms integral with a fold and extending from the fold in a direction longitudinal to said mounting section, said first arm being integral with said mounting section at said first location thereof and extending therefrom to said fold in the direction away from said second location, and said second arm extending from said fold in the direction toward said second location, 2. having first and second opposed contact surfaces disposed distal from the fold of said contact clip and arranged to receive between them and electrically engage the male connection element, said first contact surface being on one of said first arm and said mounting section, and said second contact surface being on said second arm, and 3. forming with said arms spring means resiliently urging said second surface toward said first surface.

4. An electrical contact according to claim 3 further comprising means forming a clearance void in said fold for accommodating passage of such male connection element from the side of said folded clip distal from said mounting section to within said folded clip and between said contact surfaces.

5. An electrical contact according to claim 3 further comprising means on said second arm forming protrusions extending toward said first contact surface for providing a minimum spacing of said second contact surface from said first contact surface.

6. An electrical contact according to claim 3 further comprising an end tab on said second arm forming said second surface, said tab being cold-formed to gap said second surface from said first surface by raised platforms protruding toward said first surface.

7. An electrical contact according to claim 3 further comprising a connection-passing aperture through said fold and located longitudinally in line with said opposed contact surfaces.

8. An electrical contact according to claim 3 further characterized in that said mounting section and said clip provide, other than said opposed contact surfaces, an obstruction-free path for the passage of such male connection element from between said first and second arms toward said second location of said mounting section.

9. An electrical contact according to claim 3

A. further comprising means forming a connection element-receiving channel in said mounting section extending from said first location thereof toward said second location and forming said first surface along the channel bottom surface, and B. in which at least a portion of said second arm interfits within said channel to dispose said second surface, in the absence of a male connection element interposed between said connection surfaces, within said channel.

10. An electrical contact according to claim 3

A. in which said mounting section includes an elongated shank for seating within the aperture in the contact-mounting member, and B. further comprising a longitudinal slot in said shank forming therein a pair of elongated shank branches resiliently flexible into said slot.

11. An electrical contact according to claim 3 further comprising in said mounting section a resiliently and radially compressible shank member for interferingly interfitting within the aperture in such support member for mountingly seating said contact.

12. An electrical contact according to claim 3 further comprising means forming protrusions on said second arm adjacent each of two sides of said second contact surface, said protrusions being disposed for engagement with said first contact surface for providing a minimum spacing between said contact surfaces.

13. Panel-mounted electrical socket apparatus for a circuit device from which at least one lead extends, said apparatus comprising an electrically-conductive socket contact mountingly seated within an aperture in the panel member and having a folded contact clip disposed at least partly above the panel member; said contact clip having a folded, inverted, U-shaped configuration including a first elongated member extending toward and within the aperture, a second elongated member extending alongside said first member and forming a resiliently-expandable contact area therewith for receiving therebetween the electrical lead, and a bridging fold disposed uppermost on said clip and interconnecting said elongated members, said fold being apertured to receive the lead of said circuit device for extension therethrough to said contact area.

14. A panel-mounted electrical socket contact of electrically-conductive material for mating engagement with a male connection element, said contact comprising A. a generally U-shaped folded spring member having first and second arms at least partially extending side by side in a first direction from the base of said fold, B. a contact-mounting section integral with said spring member at the end of said first arm distal from the base of said fold, and extending longitudinally with said first arm along said first direction, said mounting section being configured for seating engagement within an aperture through the panel for mounting said contact thereon and disposing said fold of said spring member on one side of said panel, C. first and second opposed contact surfaces, 1. said first contact surface being on one of said mounting sections and said first arm and said second contact surface being on said second arm, 2. extending longitudinal with said first direction and in line with the base of said fold, and 3. resiliently urged toward each other by said spring member for compressive, electrically-connecting engagement between them of such male connection element, and D. means forming an aperture through the base of said fold in said spring member for passage therethrough of such male connection element from outside said folded spring member on said one side of said panel to between said opposed contact surfaces in the direction toward the opposite side of said panel.

15. A socket for an electrical circuit package having leads arranged in two side-by-side rows extending transversely from the circuit package, said socket comprising A. an electrically-insulating body having a U-shaped cross section formed by upstanding contact-mounting enclosures arranged in two side-by-side rows for receiving such leads, and by a web extending between said rows of enclosures adjacent the bases thereof, and B. a heat sink seated 1. within said U-shape of said socket body, 2. having a panel disposed uppermost thereon for contiguous and heat-transferring engagement with the bottom of such circuit package when plugged into said socket, and 3. having thermal dissipating members extending from said panel within said U-shape of said contact body.

16. A socket according to claim 15 further comprising means in said heat sink disposing the upper surface of said panel thereof above said rows of enclosures of said socket body.

17. A socket according to claim 15 in which said heat sink further comprises

A. a pair of upstanding fin members disposed laterally outwardly of said rows of enclosures on opposite sides of said socket body and extending upwardly above said panel, and B. thermally-conductive web members mountingly joining said fin members to said panel, said web members being located beyond the ends of said rows of enclosures and extending outwardly from said U-shape to said fin members.

18. A socket according to claim 15 further characterized in that said heat sink has a cross-sectional beam-like configuration within said U-shape of said socket body and with said panel forming the upper flange thereof, and further having a base member forming the lower flange thereof and a web joining said panel with said base member, said base member being disposed adjacent said web of said socket body and wedgedly secured between said rows of enclosures for affixing said heat member to said socket body.

*19. A socket contact comprising*

*an upper interconnect section,*

*a lower termination section, and*

*an intermediate shank section*

*said shank section being separated into two longitudinally extending portions,*

*said portions being flexible and adapted to be flexed toward each other by conductively plated walls of a mounting aperture.*

*20. A socket contact comprising an end interconnect section, said section being adapted to receive in electrically connecting contact a pin,*

*said section including*

*a longer generally longitudinally extending portion with a first pin contact surface extending generally parallel to said longer generally longitudinally extending portion,*

*a shorter generally longitudinally extending portion with a second pin contact surface extending alongside said first pin contact surface, said shorter portion being shorter than said longer portion, and*

*a transverse portion integral with and foldedly connected to each of said longer portion and said shorter portion, said transverse portion having centrally thereof therethrough a hole for accepting therethrough said pin,*

*said section being a spring with said longer and shorter portions so positioned springily with respect to each other and so shaped as to engage said pin frictionally and electrically at said pin contact surfaces in consequence solely thereof.*

* * * * *